US009290848B2

(12) United States Patent
Chen et al.

(10) Patent No.: US 9,290,848 B2
(45) Date of Patent: Mar. 22, 2016

(54) ANISOTROPIC ETCH OF COPPER USING PASSIVATION

(71) Applicants: Lee Chen, Cedar Creek, TX (US); Ying Zhang, Hsinchu (CN)

(72) Inventors: Lee Chen, Cedar Creek, TX (US); Ying Zhang, Hsinchu (CN)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/320,058

(22) Filed: Jun. 30, 2014

(65) Prior Publication Data
US 2015/0376797 A1 Dec. 31, 2015

(51) Int. Cl.
H01B 13/00 (2006.01)
C23F 1/02 (2006.01)
C23F 4/00 (2006.01)
C23F 1/08 (2006.01)
H01J 37/32 (2006.01)

(52) U.S. Cl.
CPC ... *C23F 1/02* (2013.01); *C23F 1/08* (2013.01); *C23F 4/00* (2013.01); *H01J 37/32862* (2013.01); *H01J 2237/334* (2013.01)

(58) Field of Classification Search
CPC ..... H01L 21/44; H01L 21/461; H01L 21/306; C23F 1/02; C23F 1/08; H01J 37/32862
USPC ......... 430/706, 719; 216/13, 37, 67; 438/687, 438/692
See application file for complete search history.

(56) References Cited

U.S. PATENT DOCUMENTS

| 5,350,484 A | 9/1994 | Gardner et al. |
| 5,591,302 A * | 1/1997 | Shinohara et al. ............ 438/717 |
| 6,010,966 A * | 1/2000 | Ionov ............................ 438/706 |
| 2002/0072016 A1 | 6/2002 | Chen et al. |
| 2005/0224456 A1 | 10/2005 | Chen et al. |
| 2010/0173494 A1 | 7/2010 | Kobrin |
| 2013/0203260 A1 | 8/2013 | Hara et al. |

OTHER PUBLICATIONS

Yue Kuo, et al., "A New Copper Dry Etching Process", Electrochemical Society Proceedings vol. 99-30, (1999), pp. 328-335.
Fangyu Wu, et al., "Patterning of Cu Films by a Two-Step Plasma Etching Process at Low Temperature", Journal of the Electrochemical Society, vol. 157, No. 4,(2010), pp. H474-H478.
T. Suda, et al., "Development of Cu etching using $O_2$—GCIB under acetic acid gas atmosphere", 2011 Dry Processing Symposium, Topic No. 13, (2011), 2 pages.

(Continued)

*Primary Examiner* — Lan Vinh
*Assistant Examiner* — Maki Angadi
(74) *Attorney, Agent, or Firm* — Oblon, McClelland, Maier & Neustadt, L.L.P.

(57) ABSTRACT

A method for anisotropically etching a feature in a Cu-containing layer includes providing a substrate having a Cu-containing layer and a patterned etch mask formed on the Cu-containing layer such that on exposed Cu-containing layer is exposed to processing through the patterned etch mask, passivating a first surface of the exposed Cu-containing layer, and inhibiting passivation of a second surface of the Cu-containing layer. A Cu compound is formed on said second surface of the Cu-containing layer, and the Cu compound is removed from the second surface of the Cu-containing layer to anisotropically etch a feature in the Cu-containing layer.

20 Claims, 7 Drawing Sheets

(56) References Cited

OTHER PUBLICATIONS

K. L. Chavez, et al., "A Novel Method of Etching Copper Oxide Using Acetic Acid", Journal of the Electrochemical Society, vol. 148, No. 11, (2001), pp. G640-G643.

Fangyu Wu, et al., Low-Temperature Etching of Cu by Hydrogen-Based Plasmas, 2010 American Chemical Society, vol. 2, No. 8, (2010), pp. 2175-2179.

H. Kudo, et al., "Enhancing Yield and Reliability by Applying Dry Organic Acid Vapor Cleaning to Copper Contact Via-Bottom for 32-nm Nodes and Beyond", 2008 IEEE, pp. 93-95.

Ken-ichi Hara, et al., "Cu etching using $O_2$—GCIB under acetic acid atmosphere", Tokyo Electron, Technology Development Center, Univ. of Hyogo, (Dec. 5, 2011), 18 pages.

Ken-ichi Hara, "Cu etching update", Tokyo Electron, Technology Development Center, Rev. 1, (Feb. 29, 2012), 19 pages.

Peter Singer, "New Process Etches Copper", Semiconductor International, (Jan. 2, 2002), 3 pages.

International Search Report and Written Opinion issued Sep. 16, 2015 in PCT/US2015/034259 filed Jun. 4, 2015.

\* cited by examiner

ANISOTROPIC ETCH OF COPPER USING PASSIVATION

BACKGROUND OF THE INVENTION

1. Field of the Invention

The present invention relates generally to a method and an apparatus for etching copper (Cu), and more particularly to anisotropic etching of copper using passivation.

2. Description of Background Art

Copper (Cu) is emerging as the metal of choice in a wide variety of semiconductor applications. Lower electrical resistivity, coupled with improved electromigration performance and increased stress migration resistance are important material properties that favor the use of Cu over aluminum (Al) in interconnect lines and contacts. The lower electrical resistance allows signals to move faster by reducing the RC time delay. The superior resistance to electromigration, a common reliability problem in Al lines, means that Cu can handle higher power densities.

The capability to process substrates anisotropically permits the production of integrated circuit features at precisely defined locations with sidewalls that are essentially perpendicular to the surface of a masked overlayer. Anisotropic etch of Al by reactive ion etching (RIE) is well developed. For example, use of a chloride to form aluminum chloride as a by-product of the etch reaction provides good results at low temperatures. However, Cu is more difficult to etch because copper chloride forms at much higher temperatures than aluminum chloride. Thus, the introduction of Cu into multilevel metallization architecture has led to new processing methods for Cu patterning, such as the damascene approach.

The damascene approach is based on etching features in a dielectric material, filling such features with Cu metal, and chemically and physically polishing the Cu thin film by using a CMP method while leaving Cu only in the grooves. Dual damascene schemes integrate both the contacts and the interconnect lines into a single processing scheme. However, the damascene method includes complicated processes which make it difficult to define extremely fine features, and CMP suffers from yield-detracting problems of scratching, peeling, dishing and erosion. Further, overwhelming electron scattering at copper grain boundaries from the standard plating-CMP steps will likely have an adverse effect on transistor speed due to its resultant RC delay in the post ~14 nm generation technology (i.e., line width regime less than 30 nm). Thus, continued use of the damascene process for Cu patterning is unlikely and there is a need to develop improved reliable Cu etch techniques (as in the case of Al) for next generation device fabrication.

It is also expected that after dry etching copper of a large number of wafers, the chamber condition may become severely altered. As such, chamber stability is expected to suffer and the etching results are expected to drift. Thus, there is also a need to clean off the Cu deposits on the surfaces of the chamber parts, restoring the proper seasoning condition of the chamber.

SUMMARY OF THE INVENTION

It is an object of the present invention to provide a method and an apparatus for anisotropic dry etching of pure Cu layers and Cu-containing layers used in integrated circuits.

The above and other objects are achieved, according to the present invention, by providing a method for anisotropically etching a feature in a Cu-containing layer includes providing a substrate having a Cu-containing layer and a patterned etch mask formed on the Cu-containing layer such that on exposed Cu-containing layer is exposed to processing through the patterned etch mask, passivating a first surface of the exposed Cu-containing layer, and inhibiting passivation of a second surface of the Cu-containing layer. A Cu compound is formed on said second surface of the Cu-containing layer, and the Cu compound is removed from the second surface of the Cu-containing layer to anisotropically etch a feature in the Cu-containing layer.

Another aspect of the invention is a method for etching a Cu-containing layer on a substrate, which includes loading a substrate into a plasma processing chamber having a plasma source and a substrate holder, the substrate having a Cu-containing layer and a patterned etch mask formed thereupon. A passivation gas is introduced into the plasma processing chamber, the passivation gas forming a passivation layer on exposed surfaces of the Cu-containing layer, and a reacting gas is introduced into the plasma processing chamber, the reacting gas forming a first Cu-containing compound on exposed surfaces of features formed in the Cu-containing layer. The method includes introducing a reducing gas into the plasma processing chamber, the reducing gas reacting with the second Cu-containing compound to form a volatile Cu-containing compound, energizing a plasma in the plasma processing chamber, by applying at least one of DC, RF, or microwave power, to the plasma source, and applying RF bias to the substrate holder. The volatile Cu-containing compound is pumped from the plasma processing chamber, to form a pattern in the Cu-containing layer.

Still another aspect is a method for chamber cleaning. The method includes providing a plasma processing chamber having a plasma source and a substrate holder, the interior surfaces of the plasma processing chamber having a Cu-containing layer deposited thereon, and introducing a reacting gas into the plasma processing chamber, the reacting gas forming a first Cu-containing compound in the Cu-containing layer on the interior surfaces. A reducing gas is introduced into the plasma processing chamber, the reducing gas reacting with the first Cu-containing compound to form a volatile Cu-containing compound. A plasma is energized in the plasma processing chamber, by applying at least one of DC, RF, or microwave power, to the plasma source, and the volatile Cu-containing compound is pumped from the plasma processing chamber, to remove the Cu-containing layer from the interior surfaces.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
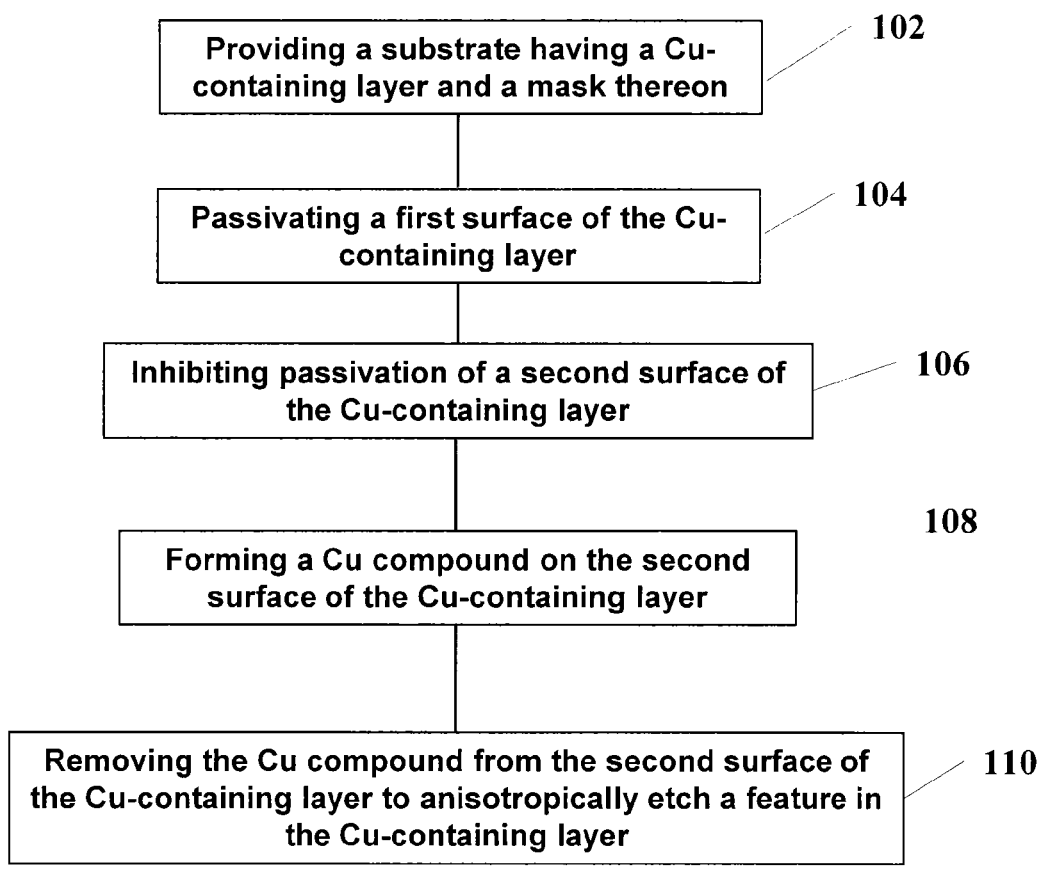
FIG. 1 is a flowchart depicting a method for etching a feature in a Cu-containing layer in accordance with embodiments of the present invention.

The embodiments will now be described with reference to the accompanying drawings, wherein like reference numerals designate corresponding or identical elements throughout the various drawings.

As noted in the background, there is a need to develop reliable techniques for pattern etching of Cu layers. The etch process generally involves providing a patterned hard mask or photoresist over a Cu-containing layer (which includes a pure Cu layer) and etching exposed portions of the Cu-containing layer through the mask.

A fluorine-copper etch system may be used because the F—Cu compound is stable and fluoride film thickness saturates at a very thin level (e.g., ~1 nm to the most, few nms). Further, there is no F diffusion into the Cu bulk during subsequent wafer fabrication steps. However, the present inventors have recognized that F—Cu compounds are too non-volatile for RIE-base etching processes. While higher halides (>F) such as Cl are volatile for RIE at elevated wafer temperatures, the present inventors also recognized that the non-saturating nature of the chloride permits Cl diffusion into the Cu bulk making Cl based etching of Cu impractical for manufacturing.

Two step plasma etching processes have also been developed for etch of Cu. For example, a first step includes using Cl-based plasmas to convert Cu to $CuCl_x$ compounds and then using either wet chemical solutions to remove CuCl compounds [Y. Kuo and S. Lee, ECS Proc. 99-30, 328, 1999] or using $Cl_2$ plasma exposures to first form $CuCl_2$ then volatilized as $Cu_2Cl_3$ by $H_2$ plasma treatments at room temperature [Fangyu Wu, Galit Levitin, and Dennis W. Hess, J. Electrochem. Soc., Vol. 157, issue 4, pp H474-H478 (2010)]. The entire contents of these documents are incorporated herein by reference. However, a main issue with Cl-based plasma etching is Critical Dimension (CD) controllability or the so called Line Edge/Width Roughness (LER or LWR) issues as technology nodes advance to the deep-nm regime.

The aforementioned limitations that are encountered when etching Cu-containing layers using conventional chlorine chemistry, show that there is a need for new low temperature dry etching methods in semiconductor manufacturing using chemical approaches that do not involve chlorine-based reactants.

In general, embodiments of the present invention pertain to a method and apparatus for etching a Cu-containing layer (which includes pure Cu layers) in manufacturing integrated circuits.

FIG. 1 is a flowchart depicting a method for etching a feature in a Cu-containing layer in accordance with embodiments of the present invention. As seen, step 102 includes providing a substrate including a Cu-containing layer and an etch mask formed on the Cu-containing layer and which exposes a portion of the Cu-containing layer. In step 104, a first surface of the exposed Cu-containing layer is passivated, while in step 106, passivation is inhibited on a second surface of the exposed Cu-containing layer. In step 108, a Cu-compound is formed on the second surface of the Cu-containing layer. The Cu compound is then removed from the second surface to anisotropically etch the Cu-containing layer as seen in step 110.

Figure 2A:
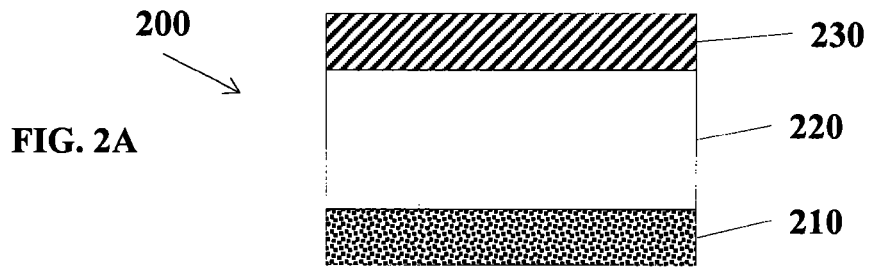
FIGS. 2A-2D show a schematic cross-sectional representation of anisotropic etching of Cu-containing layers in accordance with embodiments of the present invention.
Figure 2B:
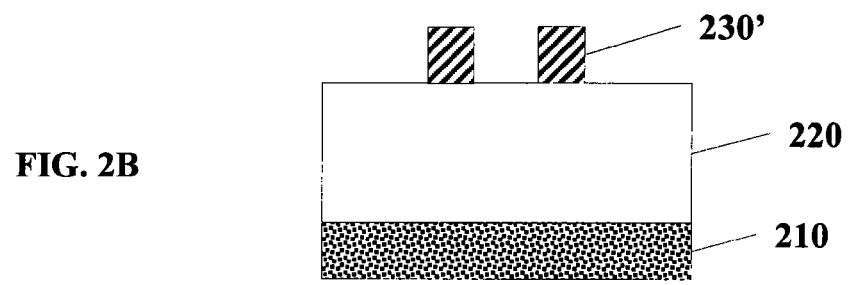
Figure 2C:
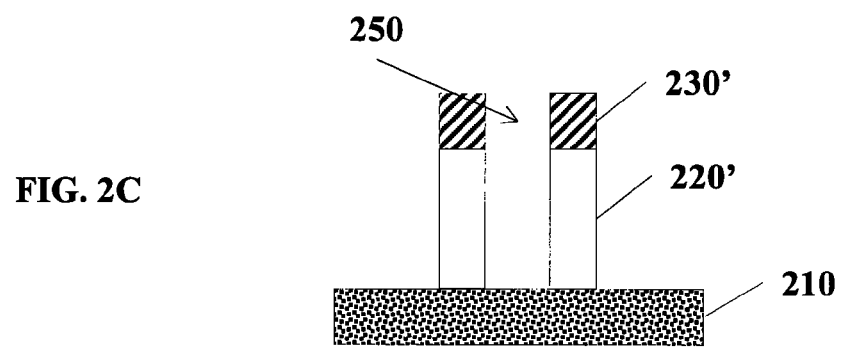
Figure 2D:
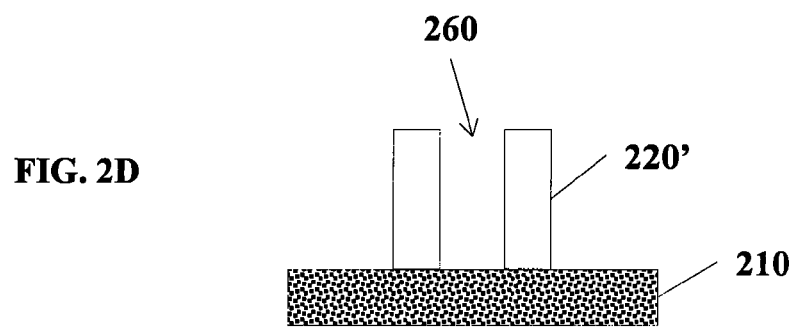

FIGS. 2A-2D show a schematic cross-sectional representation of anisotropic etching of Cu-containing layers in accordance with embodiments of the present invention. FIG. 2A shows a partially completed integrated circuit. The segment 200 comprises a substrate 210, a Cu-containing layer 220, and a hardmask or photoresist material 230 completes the structure. In order to achieve anisotropic etching of a Cu-containing layer, a resist or hardmask material overlying the Cu-containing layer is required that is resistant to the etch process performed on the Cu-containing layer. The segment 200 in FIG. 2A is processed using conventional patterning methods known in the art to produce the patterned mask layer 230' in FIG. 2B. Further, anisotropic etching of the structure in FIG. 2B according to the present invention etches the Cu-containing layer 220 while preserving the vertical geometry of the structure defined by the mask pattern 230', forming the structure 250 shown in FIG. 2C. Continued processing, as is conventional in the art, may remove the remaining photoresist or hardmask pattern 230', resulting in patterned Cu-containing layer having feature 260 as shown in FIG. 2D.

Figure 3:
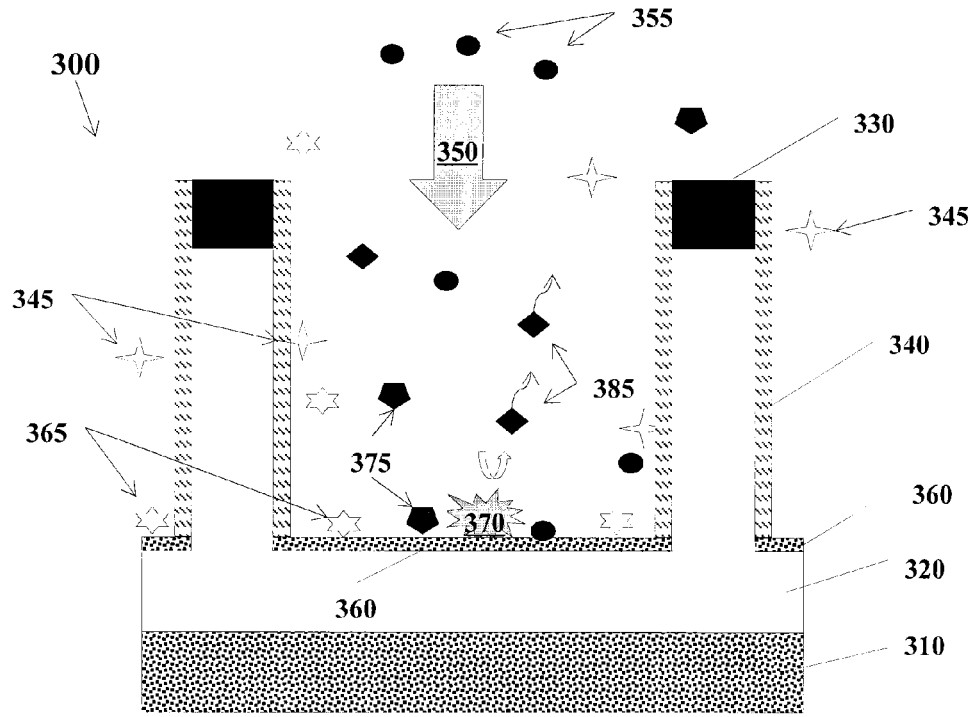
FIG. 3 schematically illustrates characteristics of the etching process that allows for anisotropic etching of Cu-containing layers in accordance with embodiments of the invention.

FIG. 3 schematically illustrates characteristics of the etching process that allows for anisotropic etching of Cu-containing layers in accordance with example embodiments of the invention. As noted in FIG. 1, the process begins in step 102 with providing a substrate having a masked Cu-containing layer. In particular, the substrate is loaded on a substrate holder in a plasma processing chamber to perform the anisotropic etch process. The plasma etcher can be of any type which is capable of applying bias to the substrate holder, such as those discussed in FIGS. 4-10 below. The segment 300 in FIG. 3 shows a partially completed integrated circuit that includes a Cu-containing layer 320 overlaying a substrate 310, and mask pattern 330 overlying the Cu-containing layer 320. In general, any suitable mask materials could be considered, such as a simple hard mask. Anisotropic etching of the structure in FIG. 3 removes the Cu-containing layer 320 while preserving the vertical geometry of the structure defined by the photoresist pattern 330.

The passivating step 104 in FIG. 1 is performed by introducing a passivation gas into the plasma processing chamber. As seen in FIG. 3, passivation gas molecules 345 are provided to the exposed (unmasked) Cu-containing layer and form a passivated surface 340. In the embodiment of FIG. 3, the passivated surface is on vertical sidewalls of a feature in the Cu-containing layer 320. Passivation may occur by either deposition on the Cu-containing layer or by growing a Cu compound on the Cu-containing layer, as will be further discussed below.

The passivation gas 345 is also provided to a bottom surface of the feature in the Cu-containing layer 320, but passivation of this surface is inhibited (step 106 in FIG. 1). More specifically, a plasma is formed in the processing chamber, and a bias on the substrate holder directs plasma ions 355 along arrow 350 toward the substrate. The directional ions 355 strike the bottom (horizontal) surface of the etch feature with sufficient energy to remove any passivation material thereon, but do not have this removal effect on passivation surface 340. The directional ions 355 may be reactive gas ions or inert gas ions. Reactive ion etching RIE, ion assisted etching or both RIE and ion assisted etching are used to keep the feature bottom clean of passivation material in accordance with embodiments of the invention.

A Cu-compound is formed on the unpassivated surface (step 108 of FIG. 1) by introducing a reacting gas into the plasma processing chamber. As seen in FIG. 3, reacting gas molecules 365 form a Cu-compound layer 360 on the non-passivated bottom surface of the feature, while the gas molecules 365 are unable to form a Cu-compound on passivated sidewalls 340. The reactive gas molecules can be neutral or ionized. In one embodiment an oxygen plasma is formed to provide energetic ions for keeping the feature bottom clean, and also to provide reactive oxygen for forming ClO on the feature bottom. That is, in one embodiment, a plasma provides directional ions 355 which are ions of the reacting gas 365.

A reducing gas is introduced into the chamber to remove the Cu-compound 360 thereby anisotropically etching the Cu-containing layer (step 110 in FIG. 1). As seen in FIG. 3, the Cu-compound layer 360 is exposed to reducing gas molecules 375, which causes a reduction reaction 370 to remove the Cu compound layer. Specifically, the reducing gas molecules 375 react with the Cu-containing compound to form a volatile Cu-containing compound 385 which is then removed from the plasma processing chamber to etch the feature in the Cu-containing layer 320. Etch of the Cu-compound 360 and the Cu-containing layer 320 may occur by Spontaneous Anisotropic Etching (SAE) or Reactive Ion Etching (RIE) or both. The reduction gas molecule 375 is inactive towards the sidewall passivant 340 made from passivation gas molecule 345.

In one embodiment, $O_2$ assumes the role of the reacting molecule and SAE of the Cu-containing layer is performed in an $O_2$-base plasma. A hardmask (e.g., TiN, $SiO_2$, $Si_3N_4$, etc.) is generally used as the masking method for $O_2$ plasma. For example, a feed-gas into the processing may chamber can include a passivation gas, plus $O_2$ gas, plus a reduction gas. An inert gas such as Ar is an optional additive. $O_2$ (with or without Ar) through RIE or ion-assisted etching keeps the feature-bottom free of the sidewall passivant made from passivation gas molecule leaving only $Cu_xO$ at the feature-bottom. While the Cu sidewall is protected by the passivant made from passivation gas molecule, $Cu_xO$ reacts spontaneously with the reduction gas molecule forming a volatile Cu compound etch product, exposing a clean Cu feature-bottom ready for the subsequent formation of $Cu_xO$ and followed by its spontaneous "etching" by the reduction gas molecule.

The reduction gas is preferably an organic compound gas. As for the organic compound, it is preferable to use one that can be supplied as it is or in a gaseous state by heating to the plasma processing system maintained in a vacuum state. Typically, an organic acid is used. As for the organic acid, it is preferable to use a carboxylic acid represented by an acetic acid (general formula: R—COOH, R being hydrogen or straight-chain or branched-chain alkyl or alkenyl of C1 to C20, preferably methyl, ether, propyl, butyl, pentyl, or hexyl). The carboxylic acid other than the acetic acid may include formic acid (HCOOH), propionic acid ($CH_3CH_2COOH$), butyric acid ($CH_3(CH_2)_2COOH$), valeric acid ($CH_3(CH_2)_3COOH$) or the like. Among the carboxylic acids, the formic acid, the acetic acid, and the propionic acid are more preferably used.

When the organic compound is acetic acid, the reaction between copper oxide and acetic acid is accelerated, and volatile $Cu(CH_3COO)$ and $H_2O$ are generated. As a consequence, copper oxide molecules are separated from the Cu film. The same reaction occurs in the case of using another organic compound (organic acid) such as formic acid or propionic acid other than acetic acid. As a result, the Cu film is etched. Thus, a non-chlorine (non-bromine as well) based ion assisted or RIE methodology for Cu plasma etching is provided.

In another embodiment, $CH_3COOH$ assumes the role of the reduction gas molecule, and the feed-gas into the chamber becomes passivation gas +$O_2$+$CH_3COOH$ (+Ar optional). The spontaneous reactions of CuO and $Cu_2O$ with $CH_3COOH$ have been studied and published by Dennis W. Hess and K. L. Chavez in 2001. In 2011 Dry Processing Symposium, T. Suda (N. Toyoda), I. Yamada (Univ of Hyogo) and Keniichi Hara (Tokyo Electron Ltd.) have demonstrated the strong reactivity between $Cu_xO$ and $CH_3COOH$ at a low pressure on the order of 1E(−5) torr. The following reactions occur:

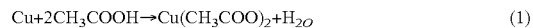

$$Cu+2CH_3COOH \rightarrow Cu(CH_3COO)_2+H_{2O} \quad (1)$$

$$Cu_2O+4CH_3COOH \rightarrow 2Cu(CH_3COO)_2+H_2O+H_2 \quad (2)$$

Thus, the reaction's volatile product is $Cu(CH_3COO)_2$.

The key ingredient of achieving the Cu SAE in this chemical system is the addition of passivation molecule which provides the sidewall passivation. There are many ways to accomplish sidewall passivation, including deposition or growth of a Cu-containing compound. One simple example is through the deposition of hydrocarbon polymer such as $C_2H_4$. It is known that the O-based plasma will consume C-based passivation layer on the sidewalls. Therefore, the process recipe will have to be able to produce a sidewall hydrocarbon deposit withstanding the depletion by the isotropic O radicals (and $O_2$, etc. as well), while through ion-assisted chemical etching or RIE keeping the feature-bottom free of any hydrocarbon deposits. For example, polyethylene polymer deposition can be accomplished by using $C_2H_4$ as a passivation molecule. An example gas mixture may be $C_2H_4$+$O_2$+$CH_3COOH$+Ar which causes reactions (1) and (2) noted above.

Another convenient example of sidewall deposition passivant is fluorocarbon. There are many such passivation molecules that could be used, for example, $CHF_3$, $C_4F_3$, $C_5F_8$, $C_2F_6$, etc. Like hydrocarbon deposits, fluorocarbon deposits are also prone to attacks by O radicals and $O_2$ neutrals, etc. Therefore, a recipe should maintain a $CF_x$-passivated sidewall while having a $CF_x$-free feature-bottom through ion-assisted chemical etching or RIE.

The sidewall passivant does not have to be a deposit; it could be a grown layer of Cu compound. One example is $CuF_x$ sidewall passivant which provides a Cu—F bond that is not only stronger than Cu—O bond, but also stable so there is less worry of F diffusion into the Cu bulk. Also, etching by $CH_3COOH$ may occur by SAE, RIE or ion assisted etching or a combination of all of these mechanisms. Anisotropic Cu etching by both ion-assisted and spontaneous processes, with $CF_x$ sidewall passivant, may be preferred.

For example, a gas mixture of $NF_3$+$O_2$+$CH_3COOH$+Ar may be used since $NF_3$ is a strong source of F atom. The following reactions occur:

SAE: $CuO + 2CH_3COOH \rightarrow Cu(CH_3COO)_2 + H_2O$ (3)

RIE: $CuO + CuF_2 + 4CH_3COOH \rightarrow 2Cu(CH_3COO)_2 + H_2O + 2HF$ (4)

In this embodiment, Fluorination and oxidation take place on all surfaces but spontaneous etching of $Cu_xO$ by $CH_3COOH$ depletes the sidewall to $CuF_X$-only, which becomes the sidewall passivant. The feature-bottom $Cu_xO$ will be spontaneously etched by $CH_3COOH$; the stronger Cu—F bond makes the reaction between $CuF_X$ and $CH_3COOH$ weaker and as a result, micro-masking by $CuF_X$ on the feature-bottom would have occurred. However, simultaneous ion bombardment on $Cu_xO$ and $CuF_X$ of the feature-bottom could weaken the Cu—F bond and lead to the formation of HF and additional $Cu(CH_3COO)_2$ as the etching product. It is to be noted that the ratio of $O_2/NF_3$ can be continuously adjusted from zero (providing RIE only) to some non-zero number (providing SAE and RIE) to achieve the desired etching results.

Where $NF_3$ is used and $Cu_3N$ could introduce some potential problems, $XeF_2$, $F_2$, etc. could be considered. For example, a feed gas of $XeF_2 + O_2 + Ar + CH_3COOH$ may be introduced in the chamber to effect reactions (3) and (4) noted above. Using a F-only source (Xe is inert) ensures a $CuF_X$-only coverage on the sidewall reactions.

While all of the above examples are "one-step plasma processes," a "multi-step" process may be used. Further, while plasma generation is discussed with respect to inhibiting passivation by RIE or ion assisted etching, a plasma may be maintained for other portions of a multistep process. The multi-step method is applicable to all types of passivants like hydrocarbon and fluorocarbon, etc., discussed above. Here, the $CuF_X$ passivant is used as an example to illustrate the multi-step method: In a first step, a weak plasma of $XeF_2$ is generated to form $CuF_X$ everywhere. In a second step, an Ar plasma is generated and a bias power to obtain a Cu-only feature-bottom through Ar ion bombardment of the feature-bottom. The third step is $O_2$ plasma with bias to form $Cu_xO$ on the feature-bottom while leaving the sidewall $CuF_X$ as a passivant. In step 4, $CH_3COOH$ is introduced and it spontaneous etches the feature-bottom $Cu_xO$ even without lighting a plasma. The four steps repeat to continue the Cu etching for a deeper feature.

As another multistep example: Step 1 is a $C_2H_4$ plasma depositing polyethylene everywhere. Step 2 is $Ar + O_2$ plasma with bias to etch off the feature-bottom polyethylene and forming $Cu_xO$ on the feature-bottom. Step 3 is $CH_3COOH$ to spontaneously etch off the feature-bottom $Cu_xO$ even without a plasma. Again, the cycle repeats for deeper etching.

In one embodiment, a method for etching a copper-containing layer on a substrate includes loading a substrate into a plasma processing chamber having a plasma source and a substrate holder, the substrate having a copper-containing layer and etch mask formed thereupon as discussed above. A passivation gas is introduced into the plasma processing chamber, the passivation gas forming a first copper-containing compound, or a passivation layer, or a combination thereof, on exposed surfaces of features formed in the copper-containing layer, while applying a first RF or microwave power to the plasma source. An inert gas is introduced into the plasma processing chamber, while applying a second RF or microwave power to the plasma source, and a reacting gas is introduced into the plasma processing chamber while applying a third RF or microwave power to the plasma source. The reacting gas forms a second copper-containing compound on exposed surfaces of features formed in the copper-containing layer as discussed above. A reducing gas is introduced into the plasma processing chamber, the reducing gas reacting with the second copper-containing compound to form a volatile copper-containing compound, and the volatile copper-containing compound is pumped from the plasma processing chamber. These steps are repeated until a pattern is formed in the copper-containing layer. An inert gas may be introduced during any one of these steps.

The time duration to perform a specific etching process may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch time, wherein the over-etch time constitutes a fraction (i.e., 1 to 100%) of the time between initiation of the etch process and the time associated with endpoint detection.

Etching performances will also be strongly affected by the type of plasma used for the etcher. As noted above, some level of bias power is required for the SAE. The nature of the plasma source will also affect the etching performance since the plasma properties affect the plasma chemistry. $CH_3COOH$ is the key molecule for reaction—its dissociation should be controlled. More importantly, the volatile Cu compound etching product, $Cu(CH_3COO)_2$, should not be dissociated once it enters into the plasma body (at a minimum requirement, its dissociation has to be as minimized as possible). A diffusion plasma is ideal in meeting these requirements.

Figure 4:
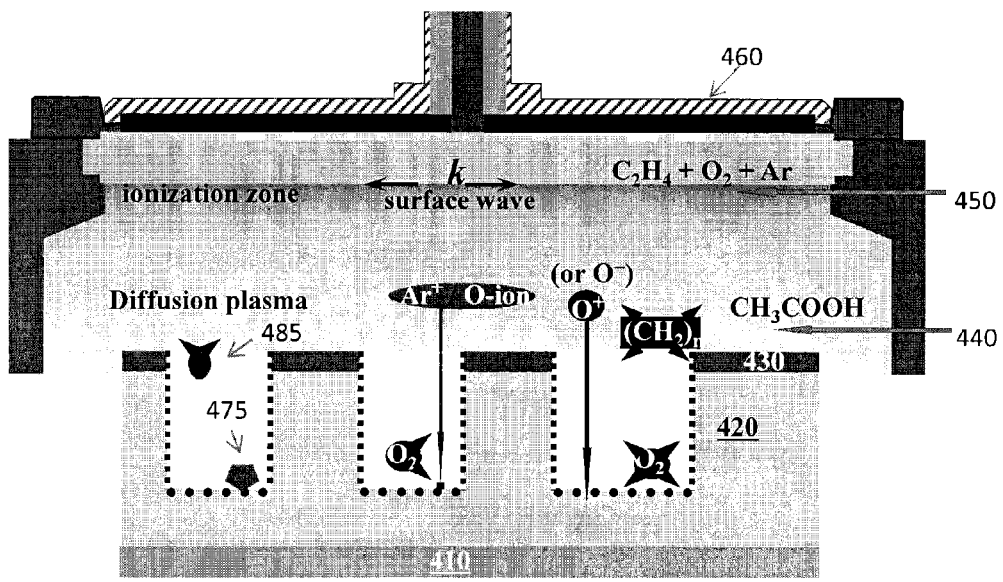
FIG. 4 is a schematic representation of a RLSA™ plasma source that may be used to generate a diffusion plasma according to embodiments of the invention.

A microwave surface wave plasma may be used to provide a diffusion plasma. In general, microwave surface wave plasma is the only plasma source that can produce a true diffusion plasma at the wafer level, in a realistic physical size wafer-etcher. FIG. 4 is a schematic representation of a radial line slot antenna (RLSA™) plasma source that may be used to generate a diffusion plasma according to embodiments of the invention. In the embodiment shown in FIG. 4, the reduction gas input 440 is proximate to the substrate and the passivation gas and reacting gas input 450 is proximate to the RLSA 460 to which microwave power is coupled. In FIG. 4, the dissociation in the diffusion plasma (i.e., at the wafer level) is essentially eliminated. As a result, the etching product $Cu(CH_3COO)_2$ can be pumped out without redeposit Cu. Also, feeding $CH_3COOH$ into the diffusion plasma (i.e., near the wafer level) essentially eliminates its dissociation. Reducing gas molecule 475 and volatile reactant 485 are also shown in FIG. 4.

Figure 5:
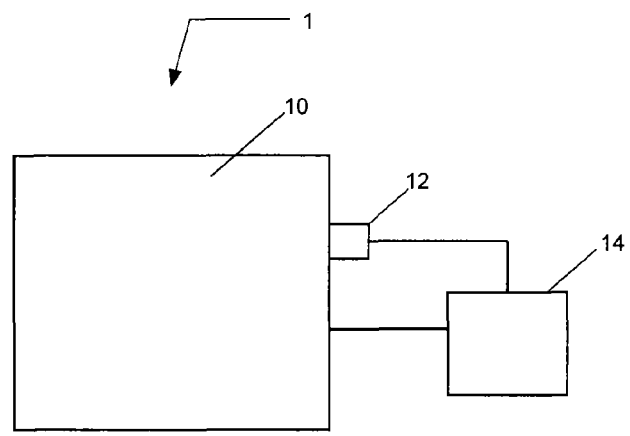
FIG. 5 depicts a plasma processing system for etching a Cu-containing layer according to embodiments.

FIG. 5 depicts a plasma processing system for etching a Cu-containing layer according to embodiments. The plasma processing system 1 includes a plasma processing chamber 10, an optional diagnostic system 12 coupled to the plasma processing chamber 10, and a controller 14 coupled to the optional diagnostic system 12 and the plasma processing chamber 10. The controller 14 is configured to execute a process recipe comprising at least one step configured to etch a Cu-containing layer, as described herein. Additionally, controller 14 is optionally configured to receive at least one endpoint signal from the diagnostic system 12 and to post-process the at least one endpoint signal in order to accurately determine an endpoint for the process. Alternatively, controller 14 utilizes a pre-determined time to set the endpoint of the process. In the illustrated embodiment, plasma processing system 1, depicted in FIG. 5, utilizes plasma for etch processing.

Figure 6:
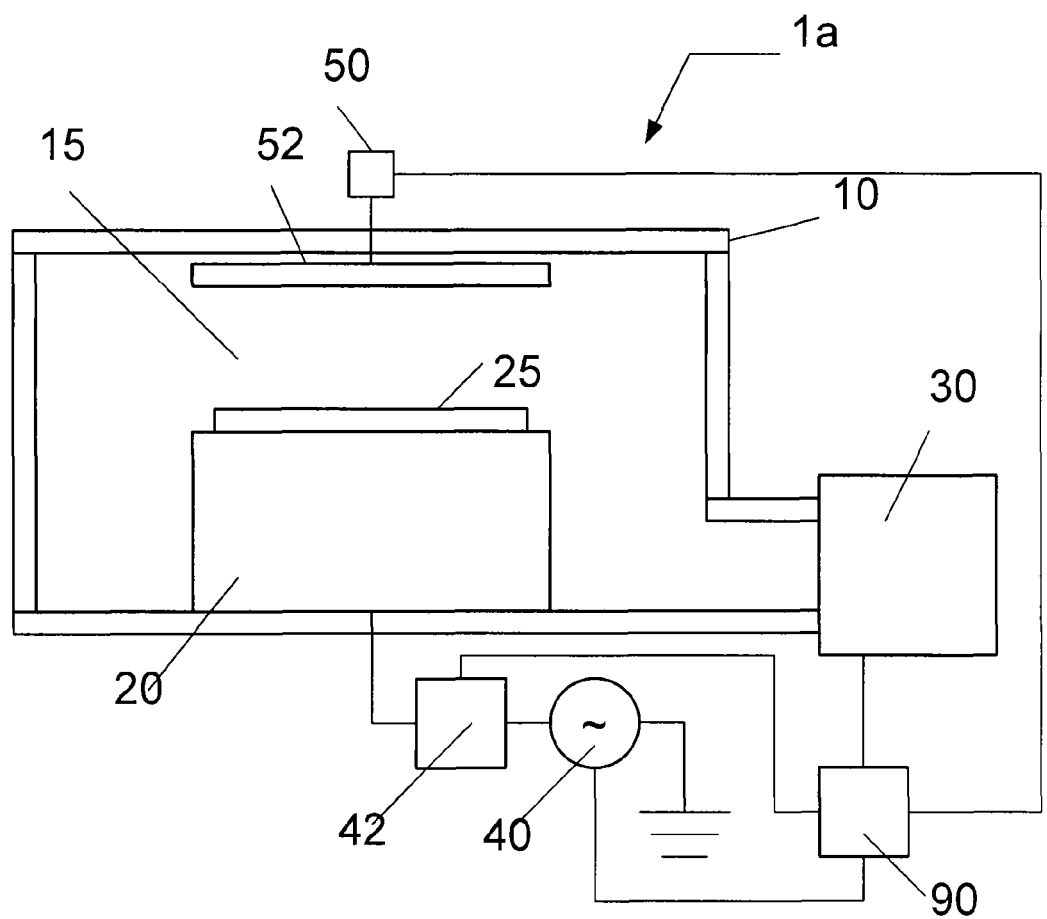
FIG. 6 illustrates another example plasma processing system for etching a Cu-containing layer according to embodiments.

FIG. 6 illustrates a plasma processing system according to another embodiment. Plasma processing system 1a comprises a plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, 450 mm substrates or larger.

Substrate 25 can be affixed to the substrate holder 20 via an electrostatic clamping system. Furthermore, substrate holder 20 can further include a temperature control system for controlling the temperature of substrate 25 during various etching processes.

Moreover, the substrate holder 20 can facilitate the delivery of heat transfer gas to the back-side of substrate 25 via a backside gas supply system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25.

In other embodiments, heating/cooling elements, such as resistive heating elements, or thermo-electric heaters/coolers can be included in the chamber wall of the plasma processing chamber 10 and any other component within the plasma processing system 1a.

In the embodiment shown in FIG. 6, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma, or affect the ion energy distribution function within the sheath, or both. In this configuration, the system can operate as a reactive ion etch (RIE) reactor, wherein the chamber can serve as ground surfaces. A typical frequency for the RF bias can range from 0.1 MHz to 100 MHz. RF systems for plasma processing are well known to those skilled in the art.

Furthermore, impedance match network 42 serves to improve the transfer of RF power to plasma in plasma processing chamber 10 by reducing the reflected power. Match network topologies (e.g. L-type, .pi.-type, T-type, etc.) and automatic control methods are well known to those skilled in the art.

Referring still to FIG. 6, plasma processing system 1a optionally comprises a direct current (DC) power supply 50 coupled to an upper electrode 52 opposing substrate 25. The upper electrode 52 may comprise an electrode plate. The electrode plate may comprise a silicon-containing electrode plate. Moreover, the electrode plate may comprise a doped silicon electrode plate. The DC power supply can include a variable DC power supply. Additionally, the DC power supply can include a bipolar DC power supply. The DC power supply 50 can further include a system configured to perform at least one of monitoring adjusting, or controlling the polarity, current, voltage, or on/off state of the DC power supply 50. Once plasma is formed, the DC power supply 50 facilitates the formation of a ballistic electron beam. An electrical filter may be utilized to de-couple RF power from the DC power supply 50.

For example, the DC voltage applied to electrode 52 by DC power supply 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

Vacuum pump system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Referring still to FIG. 6, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, optional DC power supply 50, the gas injection system (not shown), vacuum pumping system 30, as well as the backside gas delivery system (not shown), the substrate/substrate holder temperature control system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™ available from Dell Corporation, Austin, Tex.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

Figure 7:
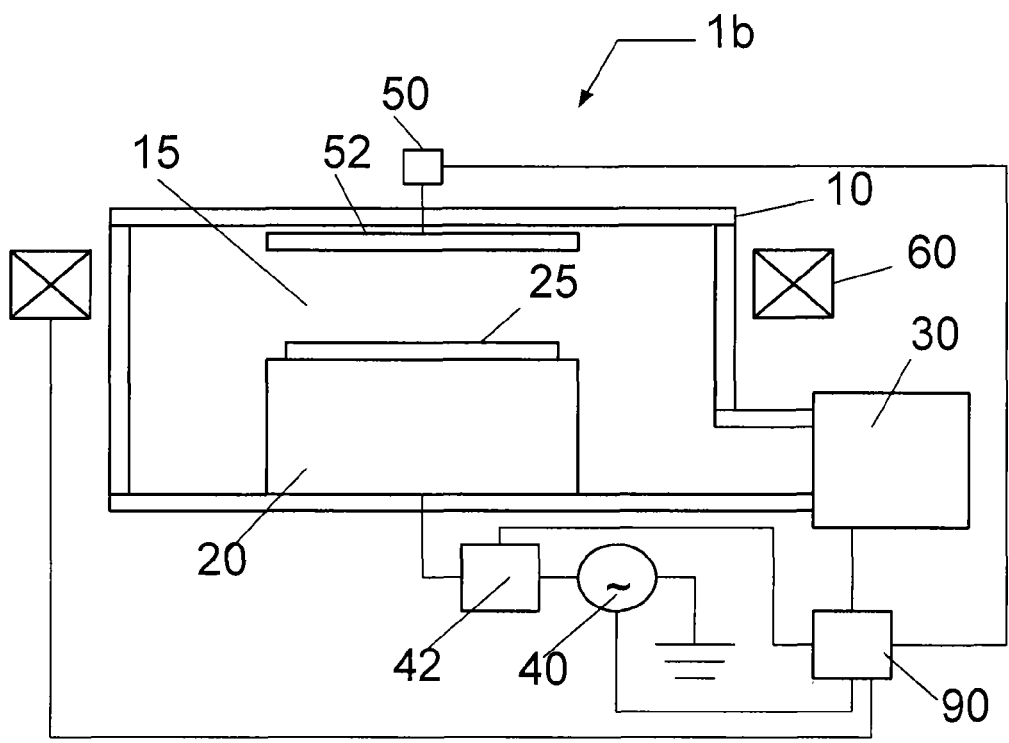
FIG. 7 depicts a plasma processing system, including magnetic field system, for etching a Cu-containing layer according to embodiments.

In the embodiment shown in FIG. 7, the plasma processing system 1b can be similar to the embodiment of FIG. 6 and further comprise either a stationary, or mechanically or electrically rotating magnetic field system 60, in order to potentially increase plasma density and/or improve plasma processing uniformity. Moreover, controller 90 can be coupled to magnetic field system 60 in order to regulate the speed of rotation and field strength. The design and implementation of a rotating magnetic field is well known to those skilled in the art.

Figure 8:
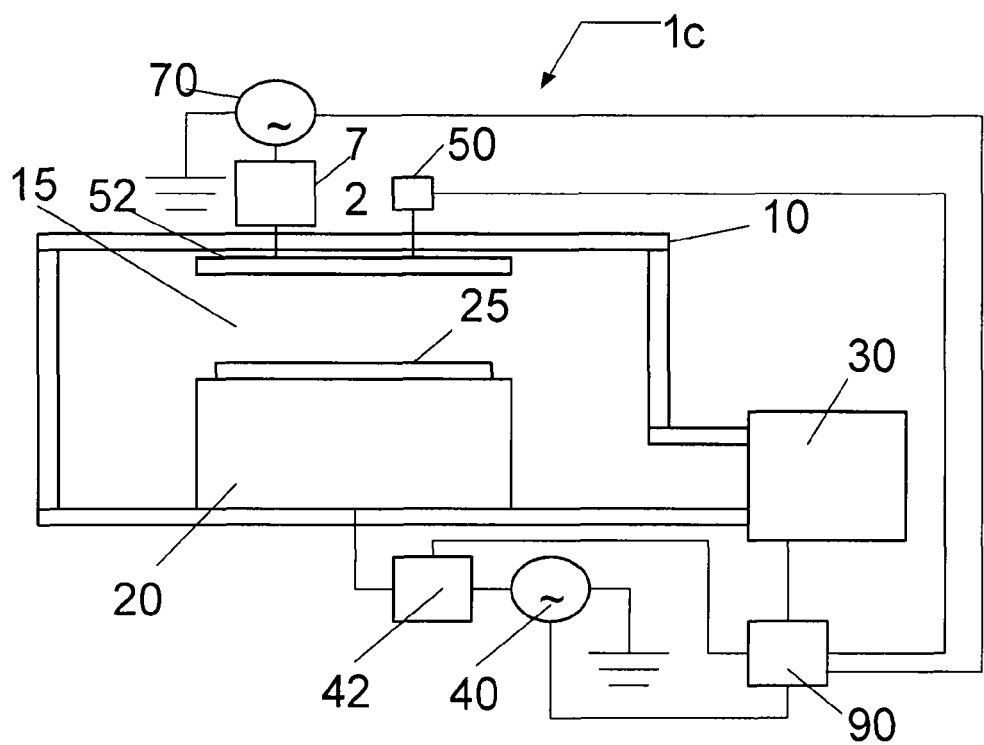
FIG. 8 depicts a plasma processing system, including RF power to upper electrode, for etching a Cu-containing layer according to embodiments.

In the embodiment shown in FIG. 8, the plasma processing system 1c can be similar to the embodiment of FIG. 6 or FIG. 7, and can further comprise an RF generator 70 configured to couple RF power to upper electrode 52 through an optional impedance match network 72. A typical frequency for the application of RF power to upper electrode 52 can range from about 0.1 MHz to about 200 MHz. Additionally, a typical frequency for the application of power to the substrate holder 20 (or lower electrode) can range from about 0.1 MHz to about 100 MHz. For example, the RF frequency coupled to the upper electrode 52 can be relatively higher than the RF frequency coupled to the substrate holder 20. Furthermore, the RF power to the upper electrode 52 from RF generator 70 can be amplitude modulated, or the RF power to the substrate holder 20 from RF generator 40 can be amplitude modulated, or both RF powers can be amplitude modulated. Desirably, the RF power at the higher RF frequency is amplitude modulated. Moreover, controller 90 is coupled to RF generator 70 and impedance match network 72 in order to control the application of RF power to upper electrode 70. The design and implementation of an upper electrode is well known to those skilled in the art.

Referring still to FIG. 8, the optional DC power supply 50 may be directly coupled to upper electrode 52, or it may be coupled to the RF transmission line extending from an output end of impedance match network 72 to upper electrode 52. An electrical filter may be utilized to de-couple RF power from DC power supply 50.

Figure 9:
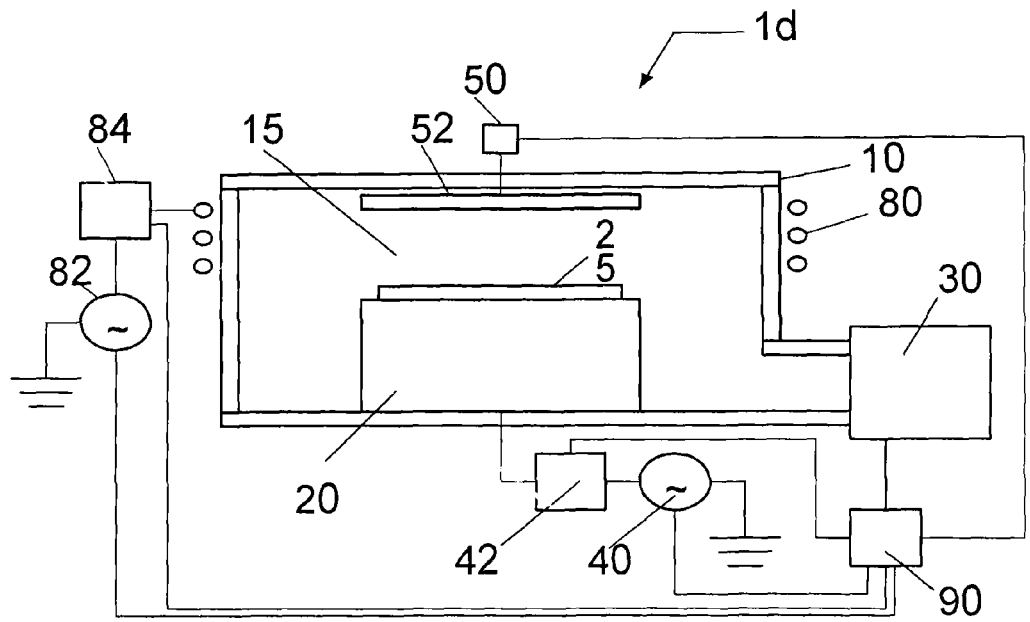
FIG. 9 depicts a plasma processing system, including an inductive coil, for etching a Cu-containing layer according to embodiments.

In the embodiment shown in FIG. 9, the plasma processing system 1d can, for example, be similar to the embodiments of FIGS. 6, 7 and 8, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the substrate holder 20 (or lower electrode) can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave as noted in FIG. 4. Each plasma source described above is well known to those skilled in the art.

Figure 10:
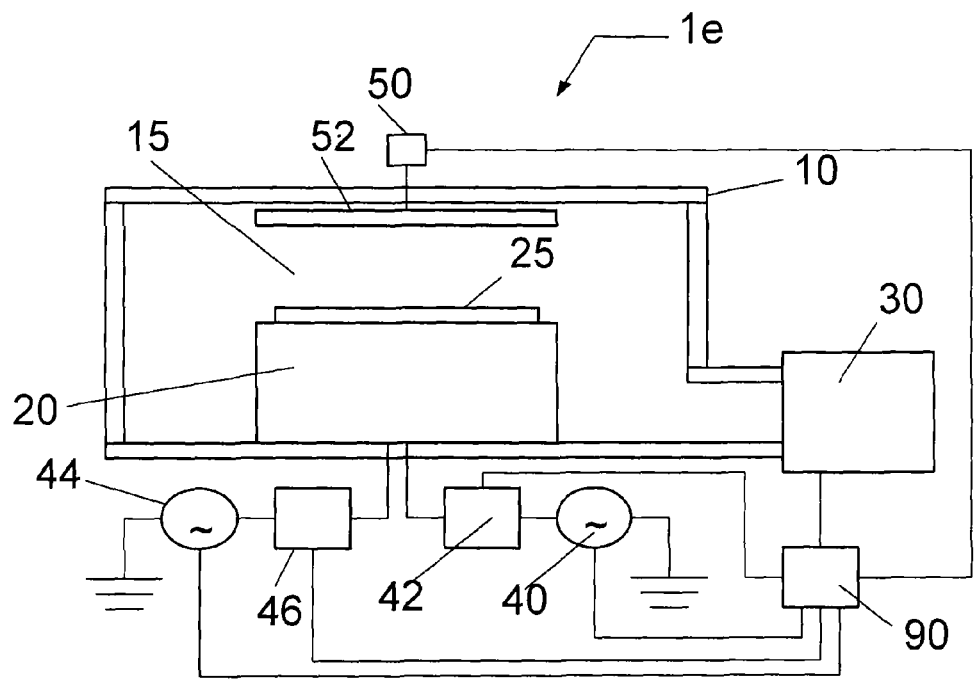
FIG. 10 depicts a plasma processing system, including a second RF generator to couple RF power to substrate holder, for etching a Cu-containing layer according to embodiments.

In the embodiment shown in FIG. 10, the plasma processing system 1e can, for example, be similar to the embodiments of FIGS. 8 and 9, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the first RF generator 40 or the second RF generator 44 or both. The RF frequency for the second RF generator 44 can be relatively greater than the RF frequency for the first RF generator 44. Furthermore, the RF power to the substrate holder 20 from RF generator 40 can be amplitude modulated, or the RF power to the substrate holder 20 from RF generator 44 can be amplitude modulated, or both RF powers can be amplitude modulated. Desirably, the RF power at the higher RF frequency is amplitude modulated. Moreover, controller 90 is coupled to the second RF generator 44 and impedance match network 46 in order to control the application of RF power to substrate holder 20. The design and implementation of an RF system for a substrate holder is well known to those skilled in the art.

As noted in the background, a method of cleaning a Cu etch chamber is needed. According to one embodiment, etch chemistry to clean off the Cu from the chamber parts; the dry clean frequency could be per wafer or per many wafers depending on the manufacturing requirements. In addition to those discussed herein, one promising Cu anisotropic plasma etching process is the $H_2$-base plasma RIE. Its exact etching mechanism is not yet scientifically concluded. However, one plausible mechanism is "plasma deep UV photon induced (and/or electron stimulated) Cu desorption after Cu-surface H-damage." Regardless the mechanism, majority of the desorbed Cu stick to the surfaces of all chamber parts. After the etching of a large number of wafers, the chamber condition will become severely altered. Therefore, chamber stability is expected to suffer and the etching results are expected to drift. Embodiments of the invention provide a dry clean method, either after each wafer or after a number of wafers, to clean off the Cu deposits on the surfaces of the chamber parts, restoring the proper seasoning condition.

Figure 11:
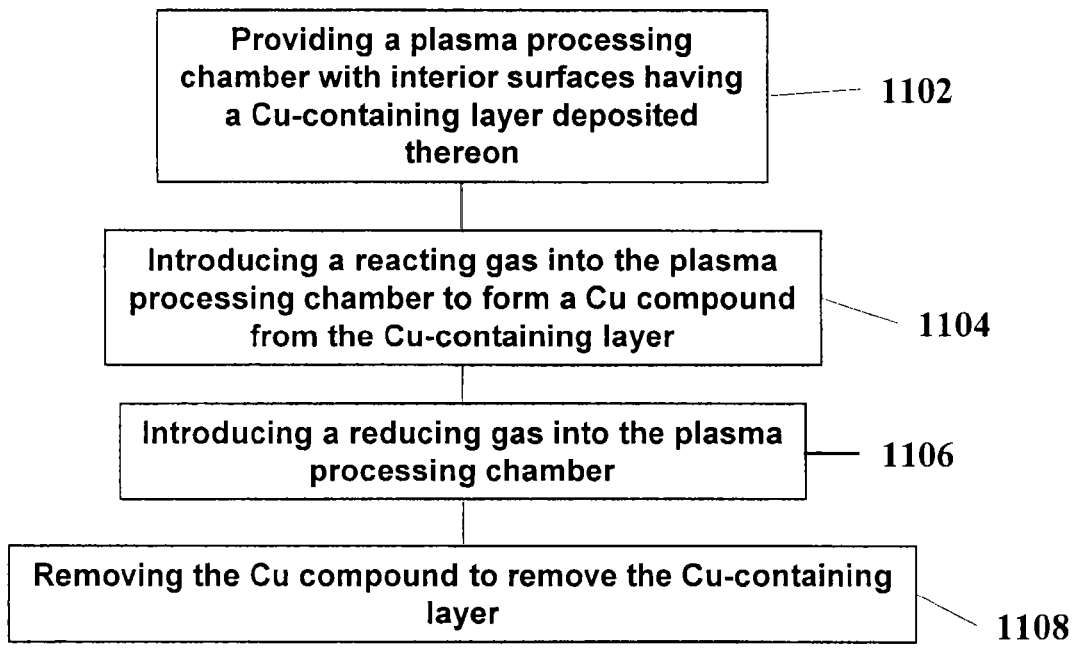
FIG. 11 provides a flow chart illustrating a method for etching a Cu containing layer according to an embodiment of the invention.

FIG. 11 provides a flow chart illustrating a method for etching a Cu-containing layer to clean a chamber interior according to an embodiment of the invention. As seen, in step 1102, a plasma processing chamber is provided having a Cu-containing layer on an interior surface. The plasma processing chamber has a plasma source and a substrate holder. In step 1104, a reacting gas is introduced into the plasma processing chamber to form a Cu-containing compound in the Cu-containing layer on the interior surface. The reacting gas may be an $O_2$ gas. In step 1106, a reducing gas is introduced into the plasma processing chamber. A plasma is provided in the plasma processing chamber by applying at least one of DC, RF, or microwave power, to the plasma source. As noted above, the reducing gas provides a reduction reaction with the Cu-compound and creates a volatile Cu-containing compound which is removed from the chamber. The reducing gas may be an organic compound such as $CH_3COOH$ discussed above. In one embodiment, a bias is not provided on the substrate holder to effect an isotropic etch of the Cu-containing deposits on the interior chamber wall.

One or more of the etching processes described above may be performed utilizing a plasma processing system such as the one described in FIGS. 5-10. However, the methods discussed are not to be limited in scope by this exemplary presentation.

Figure 12:
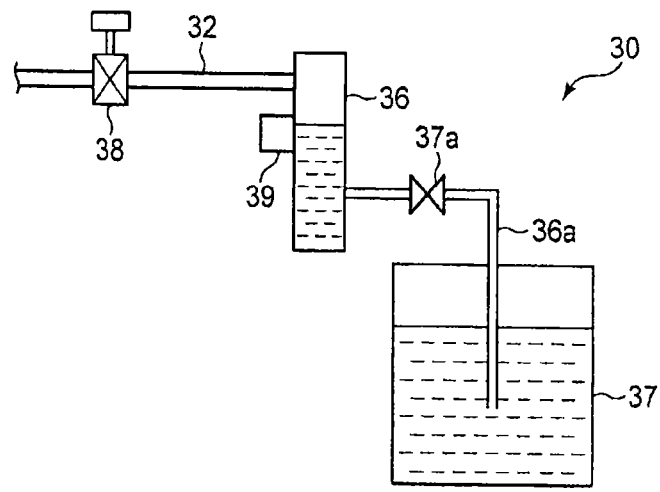
FIG. 12 illustrates an example organic compound supply unit that may be used in accordance with embodiments of the invention.

An organic compound gas is supplied from an organic compound gas supply unit into a target chamber such as shown in FIGS. 5-10. Here, an acetic acid as an organic acid is used as an example of the organic compound. FIG. 12 illustrates an example organic compound supply unit that may be used in accordance with embodiments of the invention. As seen, the organic compound gas supply unit 30 includes an intermediate vessel 36 and a tank 37 for storing an organic compound, and a valve 37a is disposed on a line 36a for connecting the intermediate vessel 36 and the tank 37. The organic compound is supplied from the intermediate vessel 36 to the target chamber through the line 32, and the line 32 is provided with a variable leak valve 38. The intermediate vessel 36 has a sensor for detecting the amount of the organic compound therein, e.g., a liquid surface sensor 39, so that the amount of the organic compound in the intermediate vessel 36 is measured. When the lowering of the liquid surface is detected by the liquid surface sensor 39, the intermediate vessel 36 is disconnected from the vacuum by the variable leak valve 38 and an organic compound is supplied from the tank 37 to the intermediate vessel by opening the valve 37a.

The organic compound (acetic acid) in the reservoir 37 is evaporated, and the evaporated organic compound is supplied to the target chamber. At this time, the evaporation amount of the organic compound (acetic acid) is controlled by controlling an opening degree of the flow rate control valve 38. The supply amount of the organic compound gas is set to a level that allows sufficient organic compound molecules to be adsorbed to the surface of the Cu film formed on the substrate S. The pressure in the target chamber 3 (partial pressure of acetic acid) is preferably about $10^{-4}$ Torr to $10^{-6}$ Torr. The pressure gauge 34 may be, e.g., an ion gauge or a capacitance monometer.

As with the embodiments discussed above, the reducing gas comprises an acid such as $CH_3COOH$, and the reacting gas comprises $O_2$. An inert gas such as He, Ne, Ar, Kr, and Xe may also be used. Further, the reacting gas and reducing gas may be introduced simultaneously into the plasma processing chamber, in a single-step process, or introduced sequentially into the plasma processing chamber, in a multi-step process.

What is claimed is:

1. A method for anisotropically etching a feature in a Cu-containing layer, the method comprising:
   providing a substrate having a Cu-containing layer and a patterned etch mask formed on the Cu-containing layer such that an exposed Cu-containing layer is exposed to processing through the patterned etch mask;
   passivating a first surface of the exposed Cu-containing layer;
   inhibiting passivation of a second surface of the Cu-containing layer;
   forming a Cu compound on said second surface of the Cu-containing layer; and
   removing the Cu compound from the second surface of the Cu-containing layer to anisotropically etch a feature in the Cu-containing layer.

2. The method of claim 1, wherein said passivating comprises depositing a passivation layer on the first surface of the Cu-containing layer or growing a Cu compound on the first surface of the Cu-containing layer.

3. The method of claim 2, wherein said depositing a passivation layer comprises depositing a hydrocarbon or a fluorocarbon on the first surface of the Cu-containing layer.

4. The method of claim 2, wherein said growing comprises growing a Cu-fluoride on the first surface of the Cu-containing layer.

5. The method of claim 1, wherein said inhibiting passivation comprises at least one of reactive ion etching (RIE) or ion assisted etching the second surface of the Cu-containing layer to remove passivation material from the second surface of the Cu-containing layer.

6. The method of claim 1, wherein said forming a Cu compound comprises forming $Cu_xO$ on the second surface of the Cu-containing layer.

7. The method of claim 1, wherein said forming $Cu_xO$ comprises supplying at least one of $O_2$ neutrals and O ions to the second surface of the Cu-containing layer.

8. The method of claim 1, wherein said removing the Cu compound comprises at least one of anisotropic spontaneous etch (SAE) and reactive ion etch (RIE) of the Cu compound from the second surface to anisotropically etch a feature in the Cu-containing layer.

9. The method of claim 1, wherein the passivation layer is preferentially formed on the sidewalls over bottom surfaces, of features formed in the Cu-containing layer.

10. A method for etching a Cu-containing layer on a substrate, the method comprising:
    loading a substrate into a plasma processing chamber having a plasma source and a substrate holder, the substrate having a Cu-containing layer and a patterned etch mask formed thereupon;
    introducing a passivation gas into the plasma processing chamber, the passivation gas forming a passivation layer on exposed surfaces of the Cu-containing layer;
    introducing a reacting gas into the plasma processing chamber, the reacting gas forming a first Cu-containing compound on exposed surfaces of features formed in the Cu-containing layer;
    introducing a reducing gas into the plasma processing chamber, the reducing gas reacting with the first Cu-containing compound to form a volatile Cu-containing compound;
    energizing a plasma in the plasma processing chamber, by applying at least one of DC, RF, or microwave power, to the plasma source;
    applying RF bias to the substrate holder; and
    pumping the volatile Cu-containing compound from the plasma processing chamber, to form a pattern in the Cu-containing layer.

11. The method of claim 10, wherein the reducing gas comprises an acid.

12. The method of claim 10, wherein the reducing gas comprises $CH_3COOH$.

13. The method of claim 10, wherein the reacting gas comprises O2.

14. The method of claim 10, wherein the reacting gas further comprises an inert gas.

15. The method of claim 14, wherein the inert gas comprises at least one of He, Ne, Ar, Kr, and Xe.

16. The method of claim 10, wherein the passivation gas comprises at least one of a fluorine-containing gas, a hydrocarbon gas, a fluorocarbon gas, and a hydrofluorocarbon gas.

17. The method of claim 10, wherein the passivation gas, reacting gas, and reducing gas, are introduced simultaneously into the plasma processing chamber, in a single-step process.

18. The method of claim 10, wherein the passivation gas, reacting gas, and reducing gas, are introduced sequentially into the plasma processing chamber, in a multi-step process.

19. The method of claim 10, wherein the plasma source and substrate holder are disposed at opposite ends of the plasma processing chamber, wherein the passivation gas and reacting gas are introduced proximate the plasma source, and wherein the reducing gas is introduced proximate the substrate holder.

20. A method for chamber cleaning, the method comprising:
- providing a plasma processing chamber having a plasma source and a substrate holder, the interior surfaces of the plasma processing chamber having a Cu-containing layer deposited thereon;
- introducing a reacting gas into the plasma processing chamber, the reacting gas forming a first Cu-containing compound in the Cu-containing layer on the interior surfaces;
- introducing a reducing gas into the plasma processing chamber, the reducing gas reacting with the first Cu-containing compound to form a volatile Cu-containing compound;
- energizing a plasma in the plasma processing chamber, by applying at least one of DC, RF, or microwave power, to the plasma source;
- pumping the volatile Cu-containing compound from the plasma processing chamber, to remove the Cu-containing layer from the interior surfaces.

* * * * *